United States Patent
Hsieh

(10) Patent No.: US 8,912,058 B2
(45) Date of Patent: Dec. 16, 2014

(54) METHOD OF FORMING A THIN FILM TRANSISTOR USING A GRAY-SCALE PHOTORESIST

(71) Applicant: Incha Hsieh, Hsinchu County (TW)

(72) Inventor: Incha Hsieh, Hsinchu County (TW)

( * ) Notice: Subject to any disclaimer, the term of this patent is extended or adjusted under 35 U.S.C. 154(b) by 0 days.

(21) Appl. No.: 14/026,166

(22) Filed: Sep. 13, 2013

(65) Prior Publication Data

US 2014/0080267 A1    Mar. 20, 2014

(30) Foreign Application Priority Data

Sep. 17, 2012    (TW) .............................. 101134003 A

(51) Int. Cl.
| | | |
|---|---|---|
| *H01L 21/00* | (2006.01) | |
| *H01L 21/84* | (2006.01) | |
| *H01L 21/3213* | (2006.01) | |
| *H01L 29/786* | (2006.01) | |
| *H01L 29/66* | (2006.01) | |
| *H01L 27/12* | (2006.01) | |

(52) U.S. Cl.
CPC .... *H01L 29/66757* (2013.01); *H01L 21/32133* (2013.01); *H01L 29/78621* (2013.01); *H01L 27/1288* (2013.01); *H01L 21/32139* (2013.01)
USPC .......................................... 438/154; 438/151

(58) Field of Classification Search
None
See application file for complete search history.

(56) References Cited

U.S. PATENT DOCUMENTS

| | | |
|---|---|---|
| 6,841,475 B1 | 1/2005 | Chen |
| 2005/0148119 A1* | 7/2005 | Fujimura ...................... 438/141 |
| 2005/0250050 A1 | 11/2005 | Chen et al. |
| 2006/0063343 A1 | 3/2006 | Chang et al. |
| 2007/0026347 A1 | 2/2007 | Yao |
| 2012/0049197 A1* | 3/2012 | Hsieh et al. ...................... 257/71 |

FOREIGN PATENT DOCUMENTS

| | | |
|---|---|---|
| JP | 2004-200651 A | 7/2004 |
| JP | 2007-053343 A | 3/2007 |
| JP | 2010-080970 A | 4/2010 |
| JP | 2012-164976 A | 8/2012 |
| WO | 2008/142873 A1 | 11/2008 |

OTHER PUBLICATIONS

European Search Report of EU Counterpart Application No. 13184571, issued on Jul. 23, 2014.

* cited by examiner

*Primary Examiner* — Charles Garber
*Assistant Examiner* — Brigitte Paterson
(74) *Attorney, Agent, or Firm* — Vedder Price PC

(57) ABSTRACT

A method of making a thin film transistor device includes: forming a semiconductor layer, a dielectric layer, and a gate-forming layer on the dielectric layer to define a layered structure, forming a gray scale photoresist pattern on the gate-forming layer, stripping the gray scale photoresist pattern isotropically to cause removal of source and drain defining regions, etching the gate-forming layer anisotropically so as to remove source and drain covering region, doping a first type dopant into source and drain regions, and removing a gate defining region from the gate-forming layer.

9 Claims, 16 Drawing Sheets

METHOD OF FORMING A THIN FILM TRANSISTOR USING A GRAY-SCALE PHOTORESIST

CROSS-REFERENCE TO RELATED APPLICATION

This application claims priority of Taiwanese Patent application no. 101134003, filed on Sep. 17, 2012.

BACKGROUND OF THE INVENTION

1. Field of the Invention

This invention relates to a method of making a thin film transistor device, more particularly to a method of making a thin film transistor device that involves the use of a gray scale photoresist pattern.

2. Description of the Related Art

Thin film transistors (TFTs) are utilized in various applications, such as liquid crystal displays (LCD). Examples of the thin film transistors include n-type thin film transistors, p-type thin film transistors, complementary metal oxide semiconductor transistors, and poly-silicon transistors. The poly-silicon transistors have recently become popular and are widely used in the LCD industry.

FIG. 1 illustrates an n-type thin film transistor that includes a substrate 11, a semiconductor layer 12 that is formed on the substrate 11, a dielectric layer 13 that is formed on the semiconductor layer 12, a gate electrode 14 that is formed on the dielectric layer 13, source and drain contacts 16 that are respectively formed on source and drain regions 124 of the semiconductor layer 12, source and drain electrodes 15 that are respectively formed on the source and drain contacts 16, and an insulator material 17 that separates the gate electrode 14 apart from the source and drain contacts 16.

The semiconductor layer 12 is made from poly silicon, and includes a central region 121, the n-type source and drain regions 124, and two transition regions 123. Each of the source and drain regions 124 is heavily doped with $n^+$ type dopant. Each of the transition regions 123 is intrinsic or is lightly doped with $n^-$ or n type dopant. The dielectric layer 13 covers the central region 121, and is made from a dielectric material that is selected from $SiO_x$, $SiN_x$, insulator material, and combinations thereof.

A conventional method of making the thin film transistor, similar to that disclosed in U.S. Patent Application Publication No. 20040266075, includes the steps of: forming a semiconductor layer on a substrate; forming a dielectric layer on the semiconductor layer; forming a gate-forming layer on the dielectric layer such that the gate-forming layer cooperates with the dielectric layer and the semiconductor layer to define a layered structure; forming a first photoresist pattern on the gate-forming layer such that the first photoresist pattern overlaps a transistor-forming region of the layered structure; removing a blank region of the layered structure, that is not covered by the first photoresist pattern, from the substrate; removing the first photoresist pattern by stripping; forming a second photoresist pattern on the gate-forming layer such that the second photoresist pattern overlaps a gate-defining region, a source transition defining region and a drain transition defining region of the layered structure and exposes a source covering region and a drain covering region of the gate-forming layer that correspond respectively to source and drain regions of the semiconductor layer; removing the source covering region and the drain covering region of the gate-forming layer by etching; doping a dopant into the source and drain regions of the semiconductor layer; removing the second photoresist pattern by stripping; forming a third photoresist pattern on the gate-forming layer such that the third photoresist pattern overlaps the gate-defining region of the layered structure and exposes two transition-covering regions of the gate-forming layer; removing the transition-covering regions of the gate-forming layer by etching so as to expose two cover zones of the dielectric layer that correspond respectively to two transition regions of the semiconductor layer; doping the dopant into the transition regions of the semiconductor layer; removing the third photoresist pattern by stripping; forming source and drain contacts on the source and drain regions of the semiconductor layer, respectively; and forming source and drain electrodes on the source and drain contacts, respectively.

The conventional method is disadvantageous in that it requires too many photolithographic and etching steps for forming the thin film transistor.

SUMMARY OF THE INVENTION

Therefore, an object of the present invention is to provide a method of making a thin film transistor device that can overcome the aforesaid drawback associated with the prior art.

According to the present invention, there is provided a method of making a thin film transistor device. The method comprises: (a) forming a semiconductor layer on a substrate; (b) forming a dielectric layer on the semiconductor layer; (c) forming a gate-forming layer on the dielectric layer such that the gate-forming layer cooperates with the dielectric layer and the semiconductor layer to define a layered structure; (d) forming a first gray scale photoresist pattern on the gate-forming layer such that the first gray scale photoresist pattern overlaps a first transistor-forming region of the layered structure and includes a first source defining region, a first drain defining region, and a first gate defining region which has a height with respect to the substrate greater than those of the first source defining region and the first drain defining region; (e) stripping the first gray scale photoresist pattern isotropically to cause thinning of the first gate defining region of the first gray scale photoresist pattern and removal of the first source defining region and the first drain defining region of the first gray scale photoresist pattern from the first transistor-forming region of the layered structure so as to expose a first source covering region and a first drain covering region of the gate-forming layer; (f) etching the gate-forming layer anisotropically so as to remove the first source covering region and the first drain covering region of the gate-forming layer from the dielectric layer after step (e) to form a first gate electrode of the gate-forming layer and so as to expose two first cover regions of the dielectric layer that correspond respectively to a first source region and a first drain region of the semiconductor layer; (g) doping a first type dopant into the first source region and the first drain region of the semiconductor layer after step (f); and (h) removing the first gate defining region of the first gray scale photoresist pattern from the gate-forming layer after step (g).

BRIEF DESCRIPTION OF THE DRAWINGS

In drawings which illustrate embodiments of the invention.

DETAILED DESCRIPTION OF THE PREFERRED EMBODIMENTS

Figure 1:
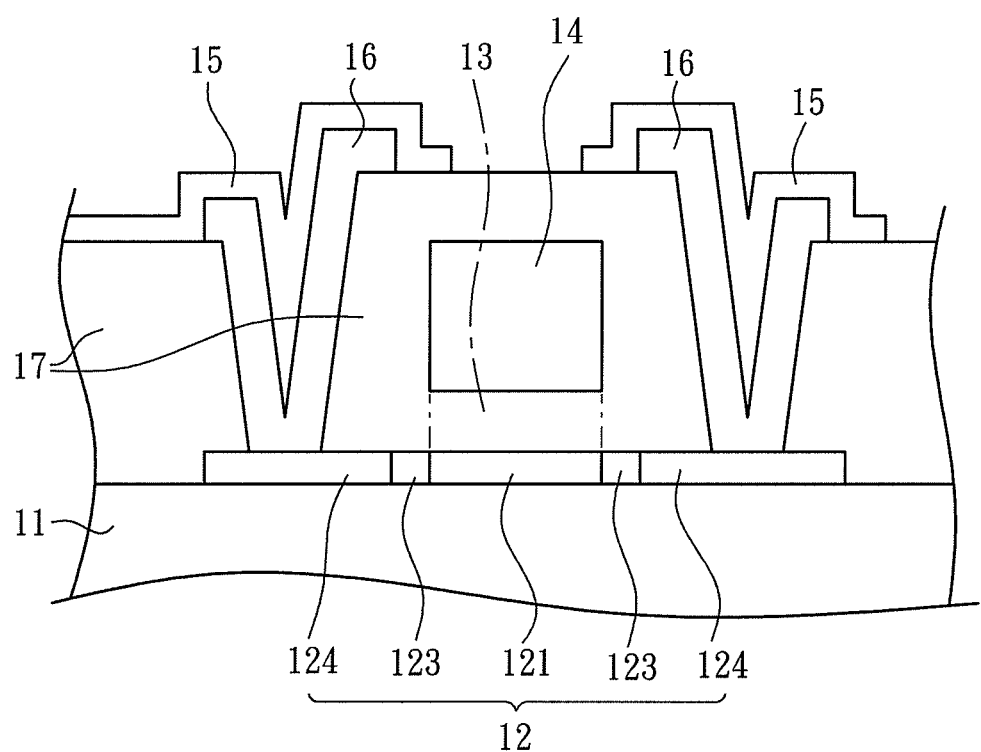
FIG. 1 is a schematic view of a conventional thin film transistor.

FIGS. 2A to 2J illustrate consecutive steps of the first preferred embodiment of a method of making a first thin film transistor device according to the present invention. The first thin film transistor device includes an n-type thin film transistor (or a first thin film transistor).

The method includes the steps of: (a) forming a semiconductor layer 51 on a substrate 11 (see FIG. 2A); (b) forming a dielectric layer 52 on the semiconductor layer 51 (see FIG. 2A); (c) forming a gate-forming layer 53 on the dielectric layer 52 such that the gate-forming layer 53 cooperates with the dielectric layer 52 and the semiconductor layer 51 to define a layered structure 50 (see FIG. 2A); (d) forming a first gray scale photoresist pattern 54 on the gate-forming layer 53 (see FIG. 2B) such that the first gray scale photoresist pattern 54 overlaps a first transistor-forming region 501 of the layered structure 50, the first gray scale photoresist pattern 54 including a first source defining region 542, a first drain defining region 543, a first gate defining region 541, a first source transition region 544 and a first drain transition region 545, the first gate defining region 541 having a height with respect to the gate-forming layer 53 greater than those of the first source defining region 542 and the first drain defining region 543, the first source transition region 544 and the first drain transition region 545 having a height with respect to the gate-forming layer 53 less than that of the first gate defining region 541 and greater than those of the first source defining region 542 and the first drain defining region 543, the first source transition region 544 being disposed between the first gate defining region 541 and the first source defining region 542, the first drain transition region 545 being disposed between the first gate defining region 541 and the first drain defining region 543; (d1) removing first blank regions 502 of the layered structure 50, that are not overlapped by the first gray scale photoresist pattern 54, from the substrate 11 by etching after step (d) (see FIG. 2C); (e) stripping the first gray scale photoresist pattern 54 isotropically to cause thinning of the first gate defining region 541 of the first gray scale photoresist pattern 54 and removal of the first source defining region 542 and the first drain defining region 543 of the first gray scale photoresist pattern 54 from the first transistor-forming region 501 of the layered structure 50 so as to expose a first source covering region 532 and a first drain covering region 533 of the gate-forming layer 53 (see FIG. 2D); (f) etching the gate-forming layer 53 anisotropically so as to remove the first source covering region 532 and the first drain covering region 533 of the gate-forming layer 53 from the dielectric layer 52 after step (e) to form a first gate electrode 531 of the gate-forming layer 53 and to expose two first cover regions 521 of the dielectric layer 52 that correspond respectively to a first source region 511 and a first drain region 512 of the semiconductor layer 51 (see FIG. 2E); (g) doping a first type dopant into the first source region 511 and the first drain region 512 of the semiconductor layer 51 (see FIG. 2F) after step (f); and (h) removing the first gate defining region 541 of the first gray scale photoresist pattern 54 from the gate-forming layer 53 (see FIG. 2J) after step (g).

In this embodiment, the method further includes the steps of: stripping the first source transition region 544 and the first drain transition region 545 from the gate-forming layer 53 after step (g) and before step (h) so as to expose two first transition-covering regions 534 of the gate-forming layer 53 (see FIGS. 2F and 2G); removing the first transition-covering regions 534 of the gate-forming layer 53 from the dielectric layer 52 by etching so as to expose two first overlaying zones 522 of the dielectric layer 52 which correspond respectively to a first source transition zone 513 and a first drain transition zone 514 of the semiconductor layer 51 (see FIG. 2H); and doping the first type dopant into the first source transition zone 513 and the first drain transition zone 514 of the semiconductor layer 51 (see FIG. 2I) before step (h). Each of the first source transition zone 513 and the first drain transition zone 514 has a concentration of dopant less than those of the first source region 511 and the first drain region 512 of the semiconductor layer 51.

The substrate 11 is preferably made from glass. The semiconductor layer 51 is preferably made from silicon or germanium, and is more preferably made from amorphous silicon or poly silicon which enhances the stability of carriers (electrons and holes) in the first thin film transistor device.

In the first preferred embodiment, the semiconductor layer 51 is made from polysilicon. Formation of the semiconductor layer 51 can be conducted by forming an amorphous silicon layer (not shown) on the substrate 11, followed by annealing the amorphous silicon layer, or by forming a polysilicon layer (not shown) on the substrate 11 and optionally annealing the polysilicon layer.

Formation of the first gray scale photoresist pattern 54 on the gate-forming layer 53 is conducted by coating a photoresist layer (not shown) on a top surface of the gate-forming layer 53, followed by photolithography using a first gray scale mask (not shown).

Preferably, the dielectric layer 52 is made from a material selected from the group consisting of $SiO_x$, SiNx, SiON, insulator material, and combinations thereof.

Preferably, the gate-forming layer 53 is made from a material selected from the group consisting of polysilicon and metal.

The doping of the first dopant can be performed using implantation, laser, or thermal diffusion doping techniques.

The concentrations of the first dopant of the first source transition zone 513 and the first drain transition zone 514 are much less than those of the first source region 511 and the first drain region 512, so that the concentrations of the first source region 511 and the first drain region 512 are substantially not changed when doping the first type dopant into the first source transition zone 513 and the first drain transition zone 514 of the semiconductor layer 51.

As compared to the aforesaid conventional method (which involves three photolithographic/etching steps for forming and processing the first, second and third photoresist patterns), the first preferred embodiment of the present invention needs only one photolithographic/etching step for forming and processing the first gray photoresist pattern 54, which considerably reduces the manufacturing costs of making the first thin film transistor device.

The first thin film transistor device thus formed is suitable for application to products, such as an LCD, an electrowetting display, an OLED.

Figure 2A:
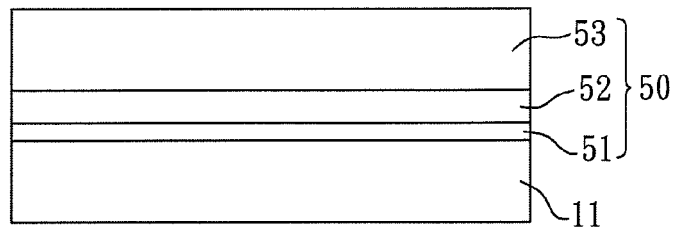
FIGS. 2A to 2L are schematic views illustrating consecutive steps of the first preferred embodiment of a method of making a first thin film transistor device according to the present invention.
Figure 2B:
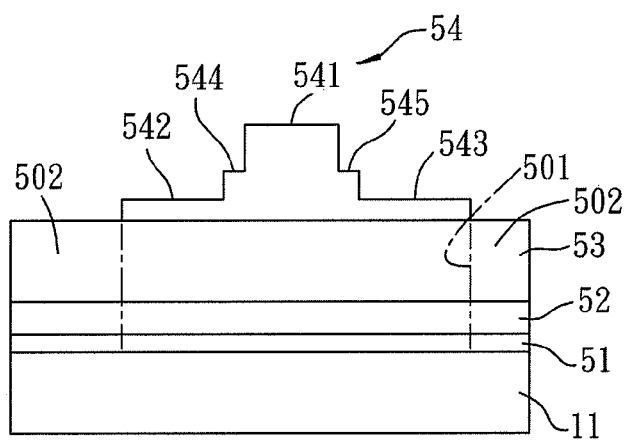
Figure 2C:
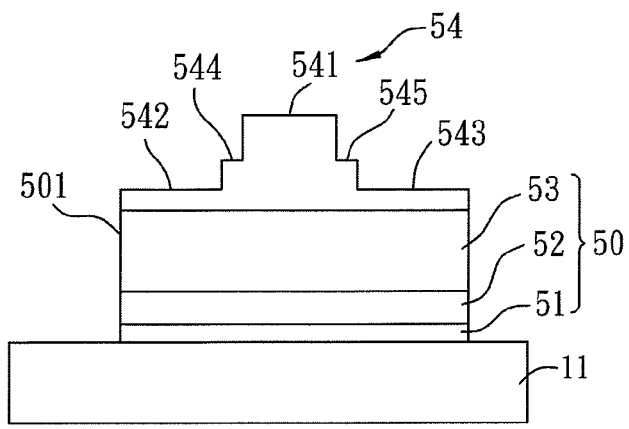
Figure 2D:
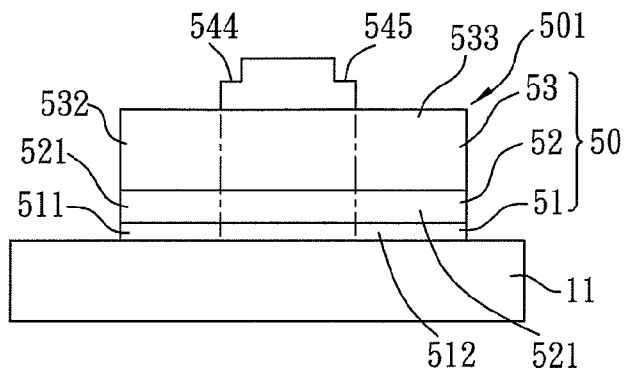
Figure 2E:
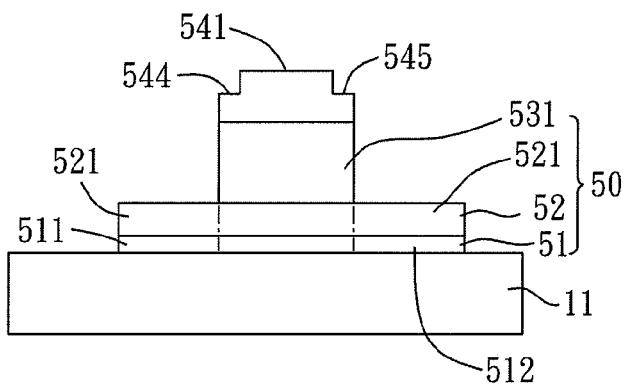
Figure 2F:
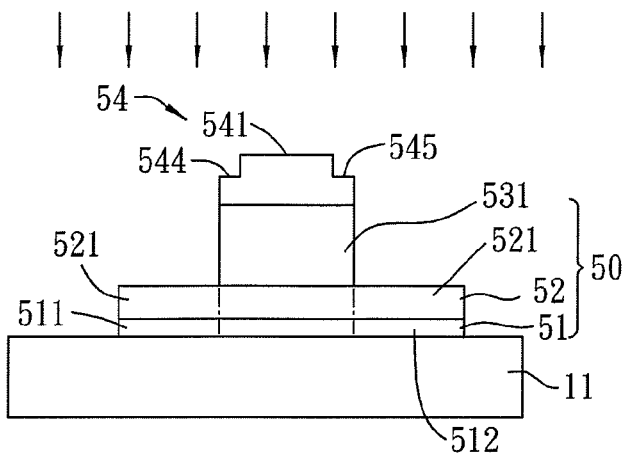
Figure 2G:
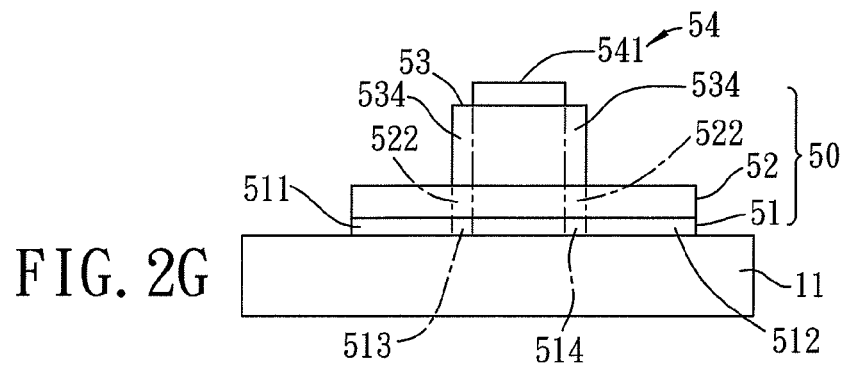
Figure 2H:
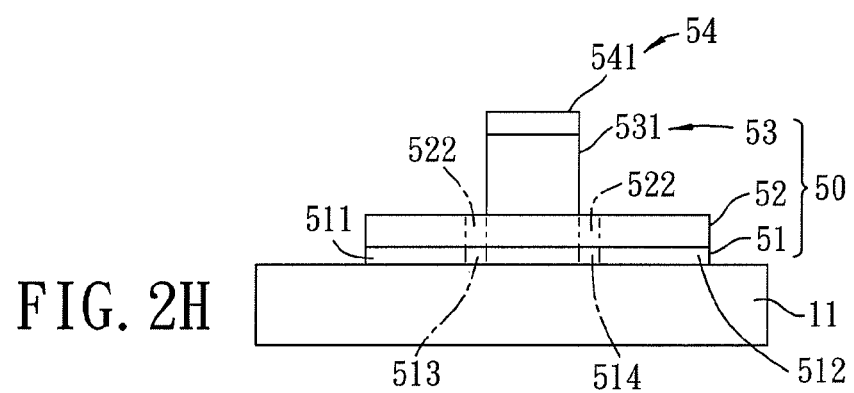
Figure 2I:
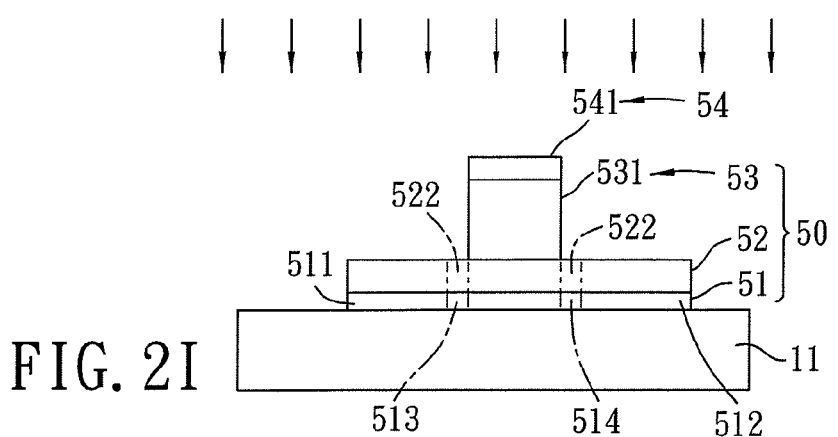
Figure 2J:
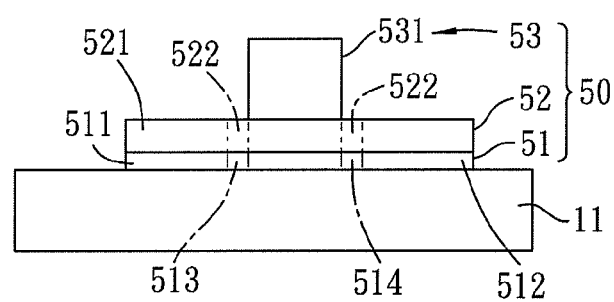
Figure 2K:
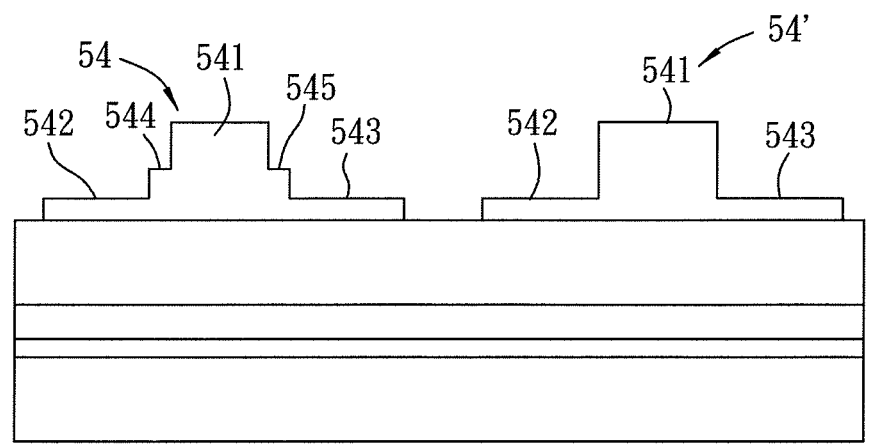
Figure 2L:
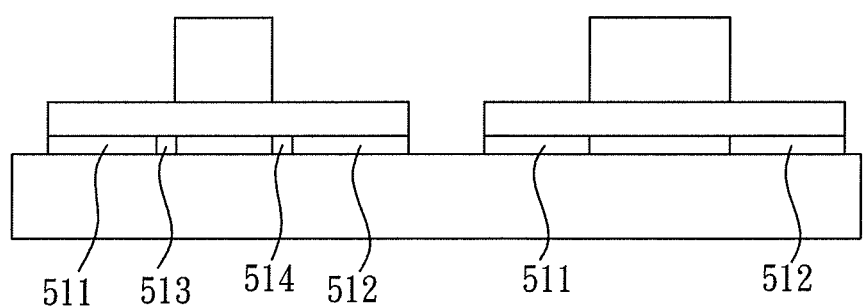

FIG. 2L illustrates a modified first thin film transistor device that includes the first thin film transistor of the first preferred embodiment and an additional first thin film transistor which includes all of the elements of the first thin film transistor of the first preferred embodiment except for the first drain transition zone 514 and the first source transition zone 513. Formation of the additional first thin film transistor involves the step of forming the first grayscale photoresist pattern 54 of the first preferred embodiment and an additional first gray scale photoresist pattern 54' that is composed of the gate defining region 541 and the source and drain defining regions 542, 543 only (see FIG. 2K).

Figure 3A:
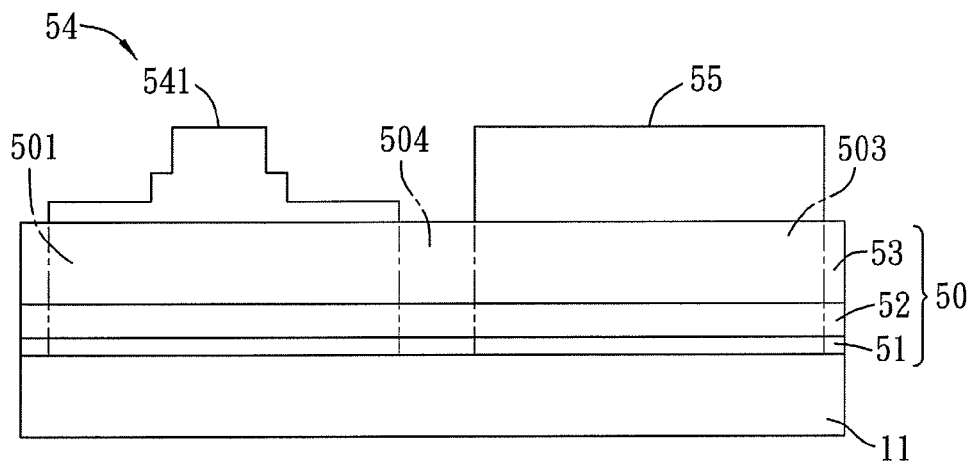
FIGS. 3A to 3Q are schematic views illustrating consecutive steps of the second preferred embodiment of a method of making a second thin film transistor device according to the present invention.
Figure 3B:
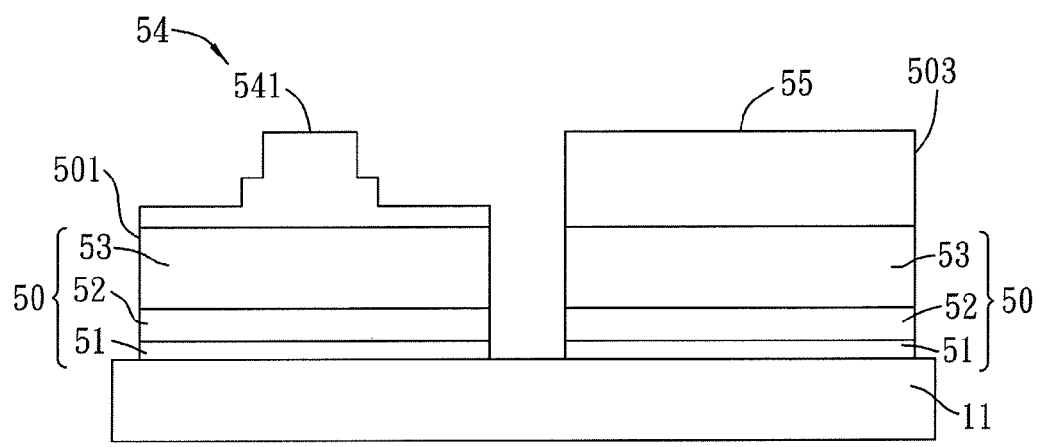
Figure 3C:
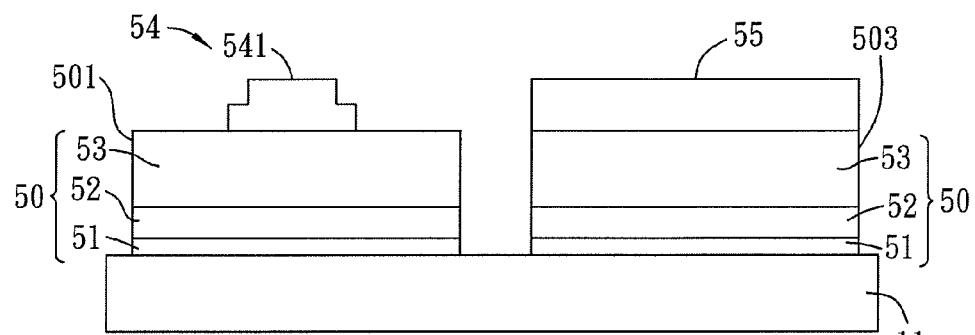
Figure 3D:
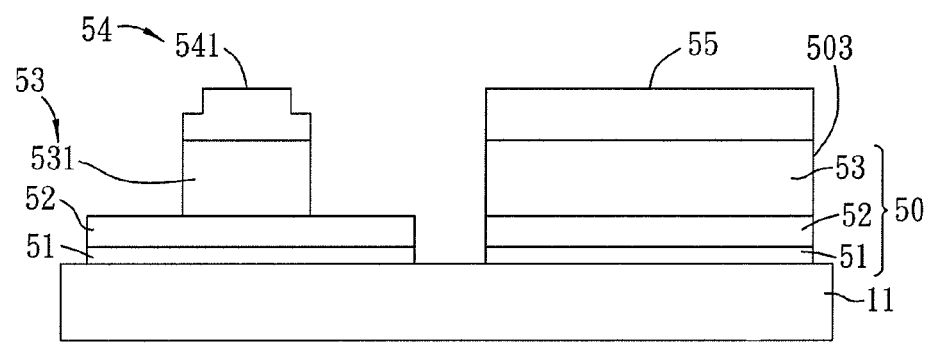
Figure 3E:
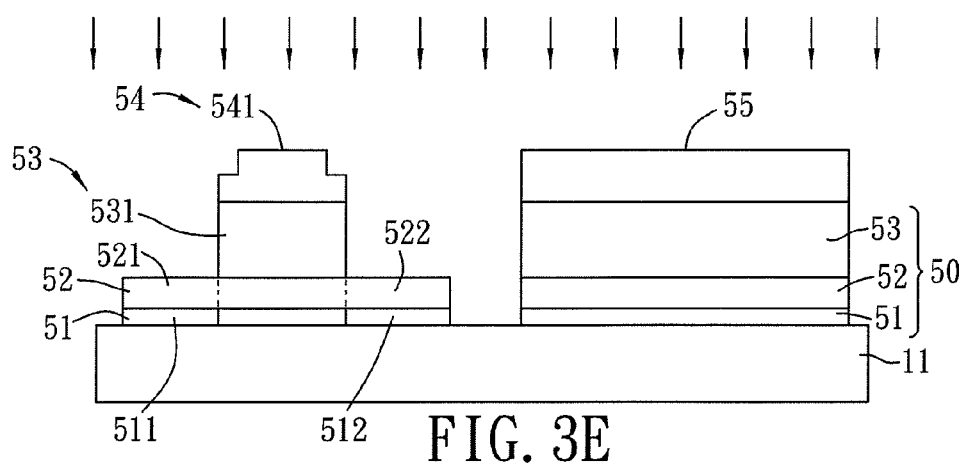
Figure 3F:
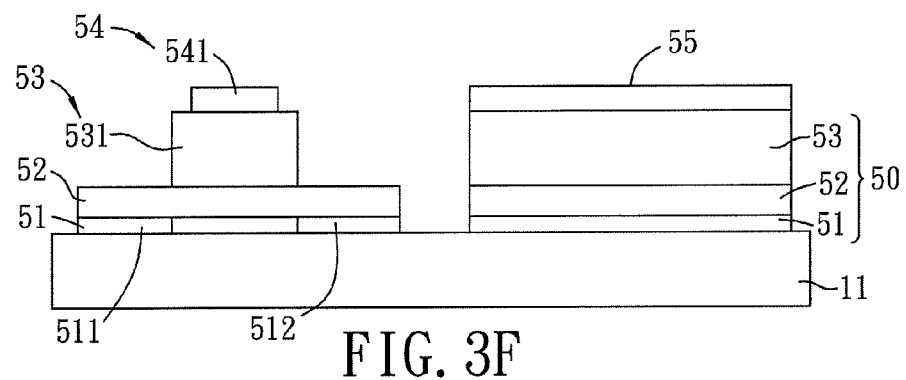
Figure 3G:
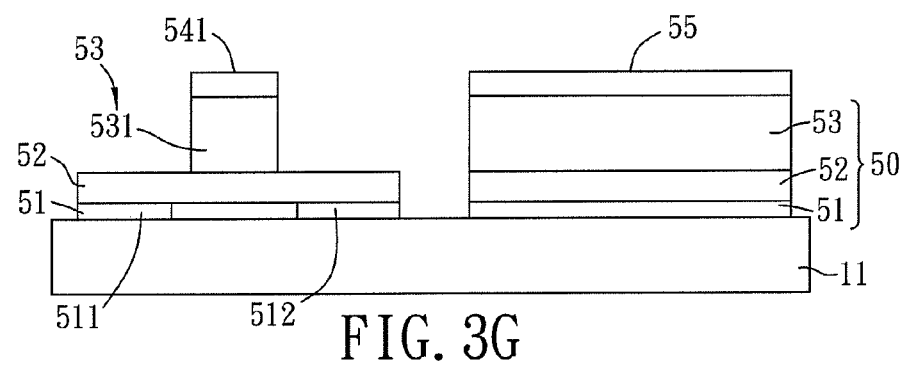
Figure 3H:
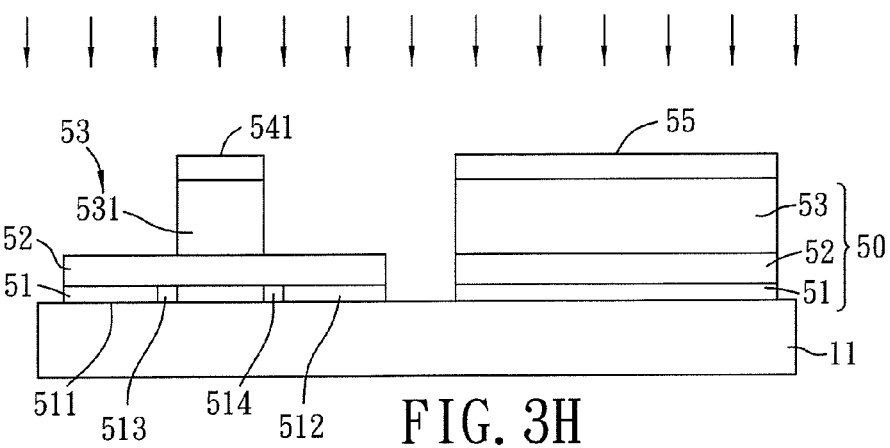
Figure 3I:
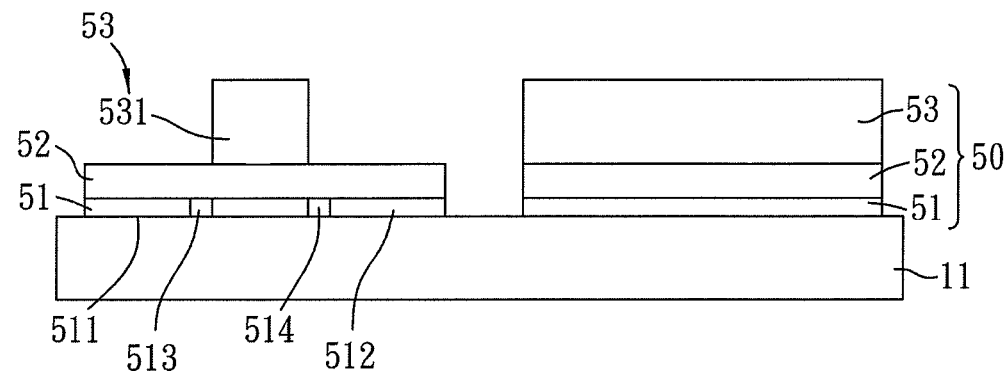
Figure 3J:
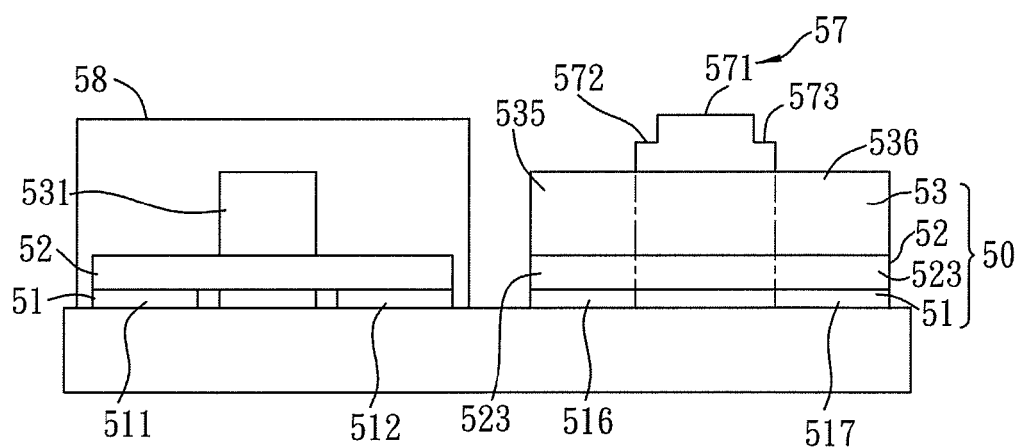
Figure 3K:
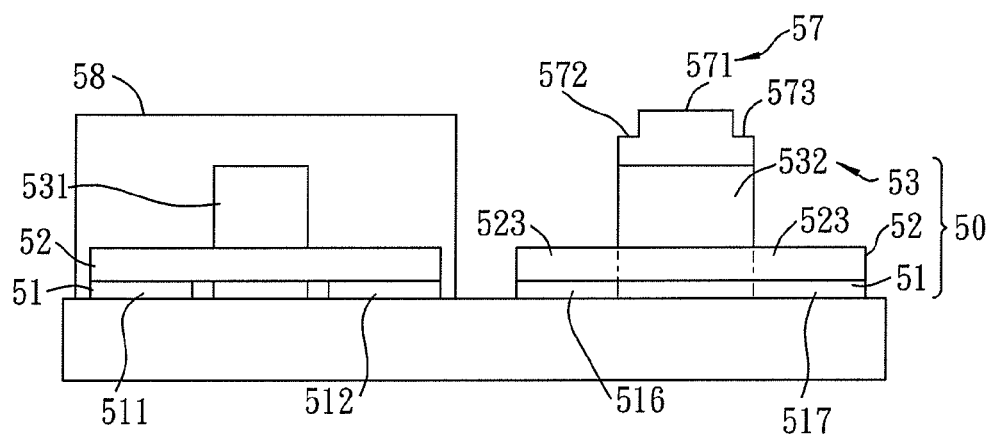
Figure 3L:
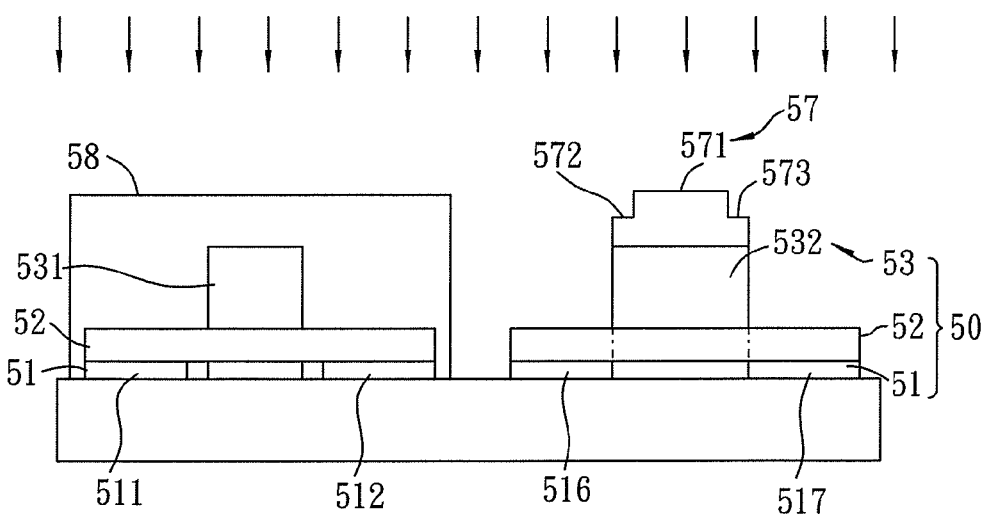
Figure 3M:
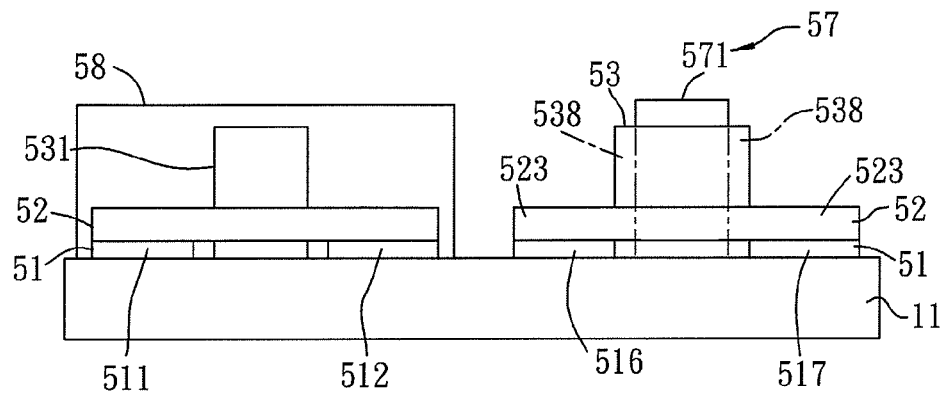
Figure 3N:
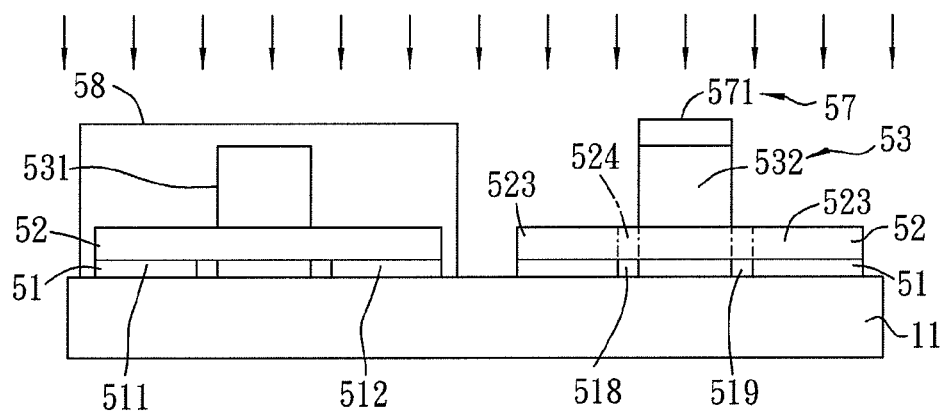
Figure 3O:
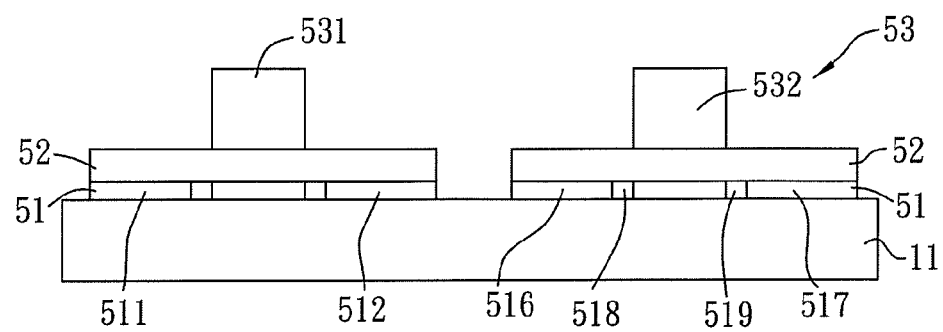

FIGS. 3A to 3O illustrate consecutive steps of the second preferred embodiment of the method of making a second thin film transistor device according to the present invention. The second thin film transistor device includes an n-type thin film transistor (i.e., the first thin film transistor) and a p-type thin film transistor (or a second thin film transistor).

The second preferred embodiment includes the steps (a) to (h) of the first preferred embodiment for forming the n-type thin film transistor (see FIGS. 3A to 3I), and further includes the following steps of forming the p-type thin film transistor: forming a non-gray-scale photoresist pattern 55 on the gate-forming layer 53 in step (d) such that the non-gray-scale photoresist pattern 55 overlaps a second transistor-forming region 503 of the layered structure 50 and is spaced apart from the first gray scale photoresist pattern 54, and that the first and second transistor-forming regions 501, 503 are separated by a spacing region 504 of the layered structure 50 (see FIG. 3A); removing the spacing region 504 of the layered structure 50 by etching (see FIG. 3B); removing the non-gray-scale photoresist pattern 55 from the gate-forming layer 53 of the second transistor-forming region 503 of the layered structure 50 in step (h) (see FIG. 3I); after step (h) (see FIG. 3J), forming an enclosing layer 58 that encloses the dielectric layer 52, the first gate electrode 531 and the first source and drain regions 511, 512 of the semiconductor layer 51, followed by forming a second gray scale photoresist pattern 57 on the gate-forming layer 53 of the second transistor-forming region 503, such that the second gray scale photoresist pattern 57 includes a second gate defining region 571, and second source and drain transition regions 572, 573 which have a height with respect to the gate-forming layer 53 less than that of the second gate defining region 571, and that the gate-forming layer 53 has a second source covering region 535 and a second drain covering region 536 which are exposed from the second gray scale photoresist pattern 57 (see FIG. 3J); removing the second source covering region 535 and the second drain covering region 536 of the gate-forming layer 53 from the dielectric layer 52 to form a second gate electrode 532 of the gate-forming layer 53 and to expose two second cover regions 523 of the dielectric layer 52 that correspond respectively to a second source region 516 and a second drain region 517 of the semiconductor layer 51; doping a second type dopant into the second source region 516 and the second drain region 517 of the semiconductor layer 51 (see FIG. 3L); and removing the second gate defining region 571 of the second gray scale photoresist pattern 57 and removing the enclosing layer 58 from the dielectric layer 52, the first gate electrode 531 and the first source and drain regions 511, 512 of the semiconductor layer 51 (see FIG. 3O).

In this embodiment, the method further includes the steps of: stripping the second source transition region 572 and the second drain transition region 573 of the second gray scale photoresist pattern 57 from the gate-forming layer 53 after doping of the second type dopant into the second source and drain regions 516, 517 of the semiconductor layer 51 so as to expose two second transition-covering regions 538 of the gate-forming layer 53 (see FIG. 3M); removing the second transition-covering regions 538 of the gate-forming layer 53 by etching so as to expose two second overlaying zones 524 of the dielectric layer 52 which correspond respectively to a second source transition zone 518 and a second drain transition zone 519 of the semiconductor layer 51 (see FIG. 3N); and doping the second type dopant into the second source transition zone 518 and the second drain transition zone 519 of the semiconductor layer 51 (see FIG. 3N). Each of the second source transition zone 518 and the second drain transition zone 519 has a concentration of the second type dopant less than those of the second source region 516 and the second drain region 517 of the semiconductor layer 51.

It is noted that the non-gray-scale photoresist pattern 55 has a height with respect to the gate-forming layer 53 not less than that of the first gate defining region 541 of the first gray scale photoresist pattern 54, and that the enclosing layer 58 has a height with respect to the substrate 11 not less than that of the second gate defining region 571 of the second gray scale photoresist pattern 57.

Preferably, the enclosing layer 58 is made from a photoresist that is the same as that of the second gray scale photoresist pattern 57.

It is further noted that removal of the non-gray-scale photoresist pattern 55 from the gate-forming layer 53 of the second transistor-forming region 503 of the layered structure 50 and removal of the first gate defining region 541 of the first gray scale photoresist pattern 54 from the gate-forming layer 53 are performed simultaneously, and that removal of the enclosing layer 58 from the dielectric layer 52 and removal of the second gray scale photoresist pattern 54 from the gate-forming layer 53 are performed simultaneously.

The second preferred embodiment of the present invention needs only two photolithographic/etching steps for forming and processing the first and second gray scale photoresist patterns 54, 57.

Figure 3P:
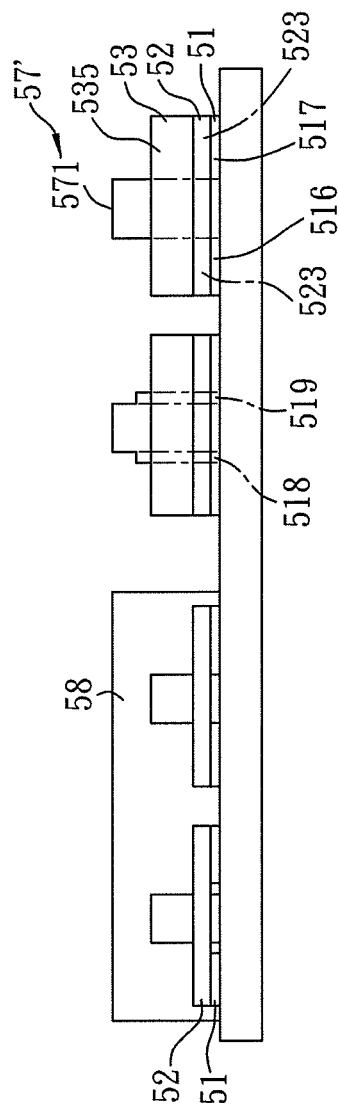
Figure 3Q:
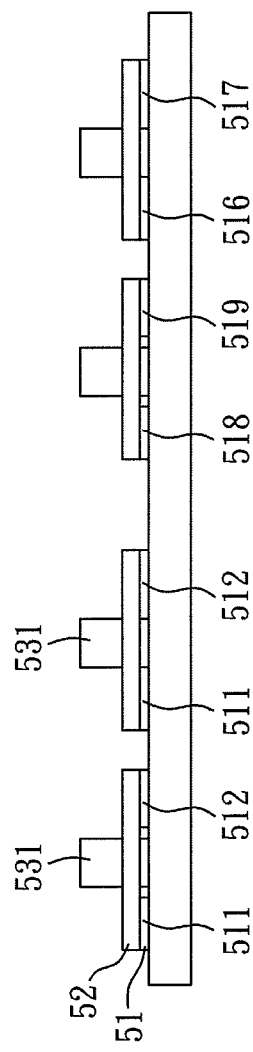

FIG. 3Q illustrates a modified second thin film transistor device that includes the first and second thin film transistors of the second preferred embodiment and additional first and second thin film transistors. The additional first thin film transistor includes all of the elements of the first thin film transistor of the second preferred embodiment except for the first drain transition zone and the first source transition zone. The additional second thin film transistor includes all of the elements of the second thin film transistor of the second preferred embodiment except for the second drain transition zone and the second source transition zone. Formation of the modified second thin film transistor device involves the steps of forming an enclosing layer 58 to enclose the first thin film transistor and the additional first thin film transistor and further forming a second gray scale photoresist pattern 57 of the second preferred embodiment and an additional second gray scale photoresist pattern 57' that is composed of the gate defining region 571 only (see FIG. 3P).

Figure 4A:
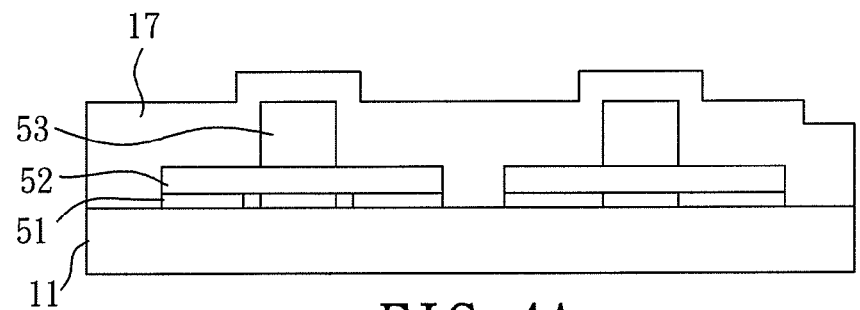
FIGS. 4A to 4I are schematic views illustrating consecutive steps that are further included in the second preferred embodiment.
Figure 4B:
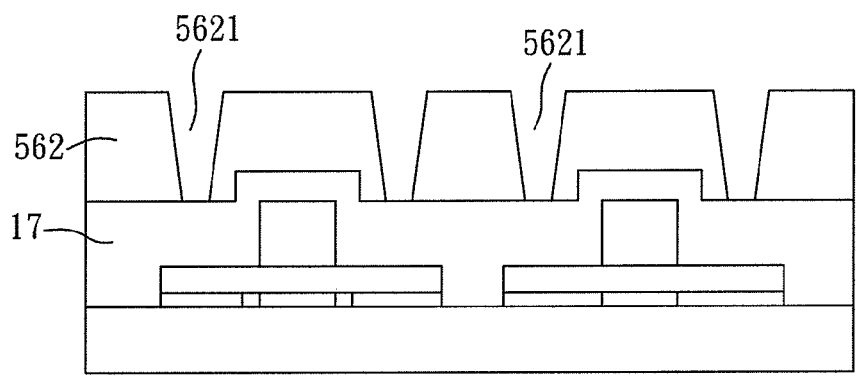
Figure 4C:
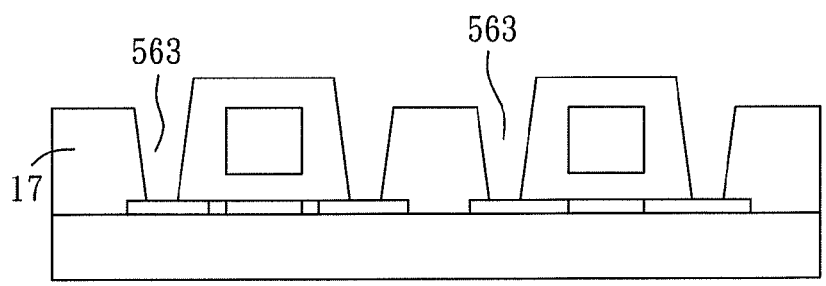
Figure 4D:
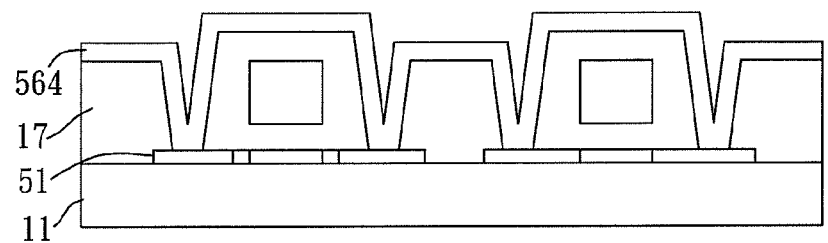
Figure 4E:
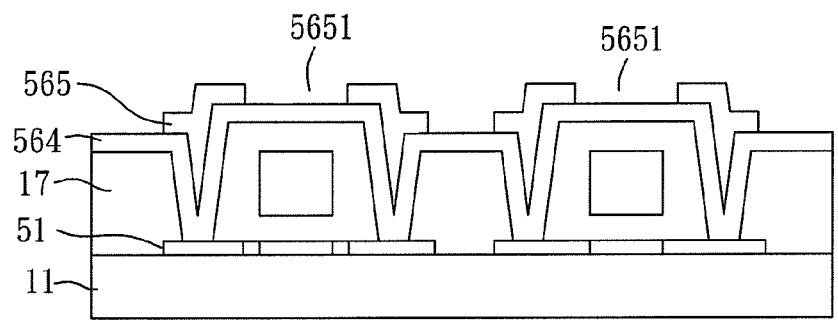
Figure 4F:
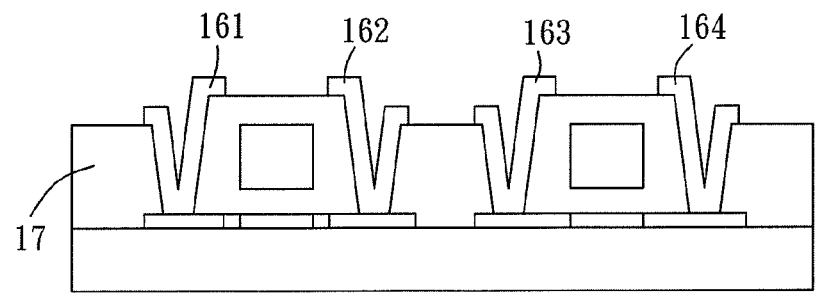
Figure 4G:
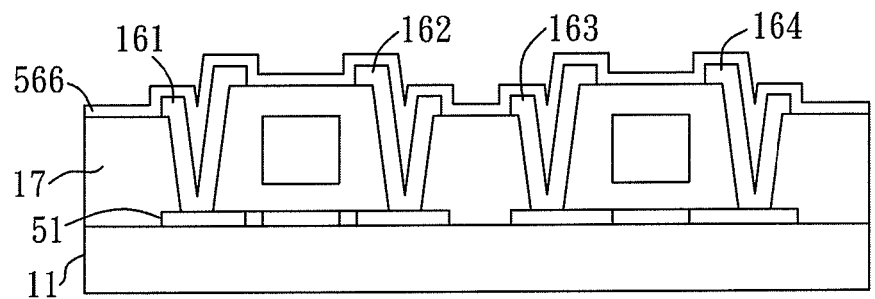
Figure 4H:
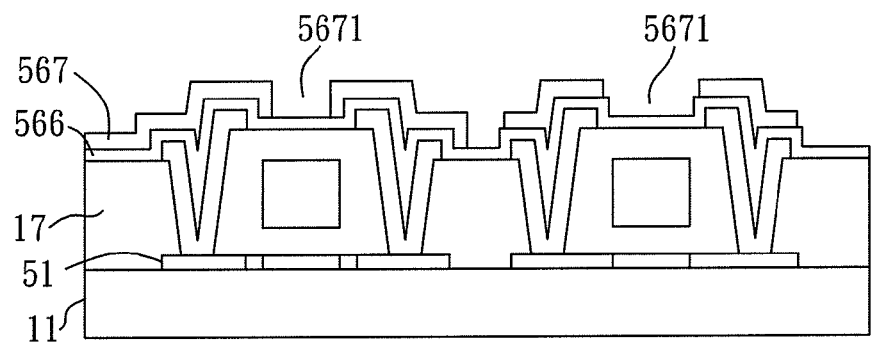
Figure 4I:
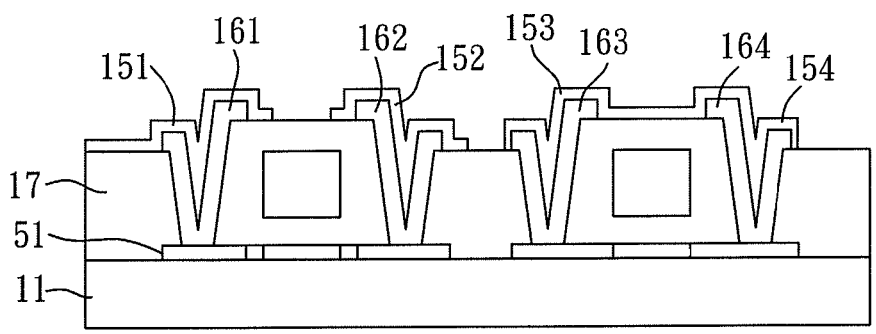

Referring to FIGS. 4A to 4I, the second preferred embodiment further includes the steps of forming an interlayer 17 of an insulator material on the dielectric layer 52 and the substrate 11 (see FIG. 4A); forming a photoresist pattern 562 having holes 5621 on the interlayer 17 (see FIG. 4B); etching the interlayer 17, that is exposed from the photoresist pattern 562, so as to form contact holes 563 extending through the interlayer 17 and the dielectric layer 52 (see FIG. 4C); forming a first metal layer 564 on the interlayer 17 such that the first metal layer 564 extends into the contact holes 563 to contact the semiconductor layer 51 (see FIG. 4D); forming a photoresist pattern 565 having holes 5651 on the first metal layer 564 (see FIG. 4E); etching the first metal layer 564 that is exposed from the photoresist pattern 565 so as to form the first metal layer 564 into a first source contact 161, a first drain contact 162, a second source contact 163, and a second drain contact 164 (see FIG. 4F); forming a second metal layer 566 on the first source contact 161, the first drain contact 162, the second source contact 163, the second drain contact 164 and the interlayer 17 (see FIG. 4G); forming a photoresist pattern 567 having holes 5671 on the second metal layer 566 (see FIG. 4H); etching the second metal layer 566 that is exposed from the photoresist pattern 567 so as to form the second metal layer 566 into a first source electrode 151, a first drain electrode 152, a second source electrode 153 and a second drain electrode 154 (see FIG. 4I).

By forming the first gray scale photoresist pattern 54 on the gate-forming layer 53 in the method of this invention, the aforesaid drawback associated with the prior art can be eliminated.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A method of making a thin film transistor device, comprising:
   (a) forming a semiconductor layer on a substrate;
   (b) forming a dielectric layer on the semiconductor layer;
   (c) forming a gate-forming layer on the dielectric layer such that the gate-forming layer cooperates with the dielectric layer and the semiconductor layer to define a layered structure;
   (d) forming a first gray scale photoresist pattern on the gate-forming layer such that the first gray scale photoresist pattern overlaps a first transistor-forming region of the layered structure, the first gray scale photoresist pattern including a first source defining region, a first drain defining region, and a first gate defining region which has a height with respect to the gate-forming layer greater than those of the first source defining region and the first drain defining region;
   (e) stripping the first gray scale photoresist pattern isotropically to cause thinning of the first gate defining region of the first gray scale photoresist pattern and removal of the first source defining region and the first drain defining region of the first gray scale photoresist pattern from the first transistor-forming region of the layered structure so as to expose a first source covering region and a first drain covering region of the gate-forming layer;
   (f) etching the gate-forming layer anisotropically so as to remove the first source covering region and the first drain covering region of the gate-forming layer from the dielectric layer after step (e) to form a first gate electrode of the gate-forming layer and to expose two first cover regions of the dielectric layer that correspond respectively to a first source region and a first drain region of the semiconductor layer;
   (g) doping a first type dopant into the first source region and the first drain region of the semiconductor layer after step (f); and
   (h) removing the first gate defining region of the first gray scale photoresist pattern from the gate-forming layer after step (g).

2. The method of claim 1, wherein the first gray scale photoresist pattern formed in step (d) further includes a first source transition region and a first drain transition region which have a height with respect to the gate-forming layer less than that of the first gate defining region and greater than those of the first source defining region and the first drain defining region, the first source transition region being disposed between the first gate defining region and the first source defining region, the first drain transition region being disposed between the first gate defining region and the first drain defining region, the method further comprising: stripping the first source transition region and the first drain transition region from the gate-forming layer after step (g) and before step (h) so as to expose two first transition-covering regions of the gate-forming layer; removing the first transition-covering regions of the gate-forming layer from the dielectric layer by etching so as to expose two first overlaying zones of the dielectric layer which correspond respectively to a first source transition zone and a first drain transition zone of the semiconductor layer; and doping the first type dopant into the first source transition zone and the first drain transition zone of the semiconductor layer before step (h), each of the first source transition zone and the first drain transition zone having a concentration of the first type dopant less than those of the first source region and the first drain region of the semiconductor layer.

3. The method of claim 1, further comprising forming a source electrode and a drain electrode on the first source region and the first drain region of the semiconductor layer, respectively.

4. The method of claim 1, wherein formation of the semiconductor layer in step (a) is conducted by forming an amorphous silicon layer on the substrate, followed by annealing the amorphous silicon layer.

5. The method of claim 1, wherein formation of the semiconductor layer in step (a) is conducted by forming a polysilicon layer on the substrate and optionally annealing the polysilicon layer.

6. The method of claim 1, wherein the dielectric layer is made from a material selected from the group consisting of $SiO_x$, SiNx, SiON, insulator material and combinations thereof.

7. The method of claim 1, wherein the gate-forming layer is made from a material selected from the group consisting of poly silicon and metal.

8. The method of claim 1, further comprising:
   forming a non-gray-scale photoresist pattern on the gate-forming layer in step (d) such that the non-gray-scale photoresist pattern overlaps a second transistor-forming region of the layered structure and is spaced apart from the first gray scale photoresist pattern and that the first and second transistor-forming regions are separated by a spacing region of the layered structure;
   removing the spacing region of the layered structure by etching;
   removing the non-gray-scale photoresist pattern from the gate-forming layer of the second transistor-forming region of the layered structure in step (h);
   after step (h), forming an enclosing layer that encloses the dielectric layer, the first gate electrode and the first source and drain regions of the semiconductor layer, followed by forming a second gray scale photoresist pattern on the gate-forming layer of the second transistor-forming region, such that the second gray scale photoresist pattern includes a second gate defining region and that the gate-forming layer has a second source covering region and a second drain covering region which are exposed from the second gray scale photoresist pattern;
   removing the second source covering region and the second drain covering region of the gate-forming layer from the dielectric layer so as to expose two second cover regions of the dielectric layer that correspond respectively to a second source region and a second drain region of the semiconductor layer;

doping a second type dopant into the second source region and the second drain region of the semiconductor layer; and removing the second gate defining region of the second gray scale photoresist pattern and removing the enclosing layer from the dielectric layer, the first gate electrode and the first source and drain regions of the semiconductor layer.

9. The method of claim 8, wherein the second gray scale photoresist pattern further includes a second source transition region and a second drain transition region which have a height with respect to the gate-forming layer less than that of the second gate defining region, the method further comprising: stripping the second source transition region and the second drain transition region of the second gray scale photoresist pattern from the gate-forming layer after doping of the second type dopant into the second source and drain regions of the semiconductor layer so as to expose two second transition-covering regions of the gate-forming layer; removing the second transition-covering regions of the gate-forming layer by etching so as to expose two second overlaying zones of the dielectric layer which correspond respectively to a second source transition zone and a second drain transition zone of the semiconductor layer; and doping the second type dopant into the second source transition zone and the second drain transition zone of the semiconductor layer, each of the second source transition zone and the second drain transition zone having a concentration of the second type dopant less than those of the second source region and the second drain region of the semiconductor layer.

* * * * *